United States Patent [19]

Ito et al.

[11] Patent Number: 5,198,964
[45] Date of Patent: Mar. 30, 1993

[54] PACKAGED SEMICONDUCTOR DEVICE AND ELECTRONIC DEVICE MODULE INCLUDING SAME

[75] Inventors: Mamoru Ito, Gunma; Usuke Enomoto, Isezaki; Tomoo Sakamoto, Takasaki, all of Japan

[73] Assignee: Hitachi, Ltd., Tokyo, Japan

[21] Appl. No.: 765,217

[22] Filed: Sep. 24, 1991

[30] Foreign Application Priority Data

Sep. 27, 1990 [JP] Japan ............................ 2-259575

[51] Int. Cl.⁵ .............................................. H05K 7/20
[52] U.S. Cl. ........................................ 361/386; 361/383; 361/400; 361/401; 361/421; 257/796; 257/675
[58] Field of Search ................ 357/70, 72, 74, 80, 357/81; 361/380, 383, 386, 388–389, 392, 400, 401, 421

[56] References Cited

U.S. PATENT DOCUMENTS

| | | | |
|---|---|---|---|
| 3,836,825 | 9/1974 | Hall et al. | 361/386 |
| 4,630,172 | 12/1986 | Stenerson et al. | 361/386 |
| 4,731,693 | 3/1988 | Berg et al. | 361/386 |
| 5,021,925 | 6/1991 | Soboleski | 361/386 |
| 5,065,281 | 11/1991 | Hernandez et al. | 361/388 |

FOREIGN PATENT DOCUMENTS

| | | |
|---|---|---|
| 45-11775 | 4/1970 | Japan . |
| 49-36514 | 10/1974 | Japan . |
| 53-68581 | 6/1978 | Japan . |
| 57-178370 | 11/1982 | Japan . |
| 58-137256 | 8/1983 | Japan . |
| 0186700 | 7/1989 | Japan .................. 361/386 |

Primary Examiner—Gregory D. Thompson
Attorney, Agent, or Firm—Pennie & Edmonds

[57] ABSTRACT

A packaged semiconductor device and an electronic device module having such packaged semiconductor device. The package semiconductor device includes a semiconductor wafer chip, electrode leads, connection conductors for interconnecting the chip and the electrode leads, a heat sink block attached to the semiconductor wafer chip and a mold block. The mold block has a first mold block portion for molding the semiconductor wafer chip, electrode leads, connection conductors and a first portion of the heat sink block relatively nearer to the semiconductor wafer chip and a second molde block portion for molding a second portion of the heat sink block relatively farther from the semiconductor wafer chip. The second mold block portion is smaller than the first mold block portion and extending from the mold block portion so that the mold block has, as whole, has such a shape as having a raised land on its one side projecting in an outward direction. The second portion of the heat sink block has a surface exposed from the second mold block portion.

7 Claims, 18 Drawing Sheets

PACKAGED SEMICONDUCTOR DEVICE AND ELECTRONIC DEVICE MODULE INCLUDING SAME

BACKGROUND OF THE INVENTION

The present invention generally relates to a semiconductor device and, more particularly, to a technique which can be effectively applied to a field effect transistor for power amplification of high frequency band, e.g., UHF band.

Conventionally, an electronic device module for high frequency amplification (which module will be referred to merely as the module, hereinafter) is known as an electronic device. This sort of module will be briefly explained by referring to FIG. 1.

FIG. 1 shows, in plan view, a Prior Art high frequency amplification module already assembled but not coated or sealed with resin. In the drawing, high frequency current is input and output to field effect transistor (FET) chips 14a, 14b and 14c through a high-frequency power matching circuit which comprises a plurality of conductive strip lines 18 and capacitors 21 (C1 to C13). More specifically, high frequency power is supplied from an input lead 22d through the matching circuit to the respective FET chips 14a, 14b and 14c, where the power is amplified and then externally output from an output lead 22a via the matching circuit.

Printed resistors 20 include bleeder resistors for obtaining a predetermined bias voltage, high-frequency current blocking resistors and voltage supply resistors to the respective FETs. These printed resistors 20 are shown in the form of hatched rectangles. An automatic power control (APC) lead 22c is a terminal for control of output power while a power supply lead 22b is a terminal for power supply. 0 V or a positive DC voltage is applied to lead 22c, while a positive DC voltage is applied to the lead 22b. A header 11, which corresponds to a minus terminal of a DC power source, functions as a heat radiating plate and as a grounding (GND) terminal. The header 11 also acts as a flange for fixed mounting of the module.

The module of FIG. 1 further includes a ceramic substrate 4, through holes 12a, 12b and 12c made in the ceramic substrate, heat sinks 13a, 13b and 13c, post tabs 15a, 15b and 15c, aluminum bonding wires 16a, 16b and 16c, and GND lines 19 which are electrically connected to the rear surface (which is metallized) of the ceramic substrate 4 by the through-hole printing.

For a better understanding of the present invention, explanation will be made as to the FET chip 14a as the output stage of the module of FIG. 1 and a peripheral part thereof, with reference to FIG. 2 showing its cross-sectional view. The header or support plate 11 is made of a copper plate coated at its both surfaces with nickel (Ni). Placed on one surface of the header 11 is the ceramic substrate 4 on which a wiring pattern of Cu strip line conductors 18 and the rear surface (facing the header 11) of which is solid printed with Cu. Solder 3 interconnects the rear surface of the ceramic substrate 4 and the front surface of the header 11. Further soldered by means of the solder 3 onto the front surface of the header 11 with Au-Si eutectic is the Cu-made heat sink 13a to which the Si-FET chip 14a is previously die-bonded. In the illustrated example, the front surface of the heat sink 13a the is plated with Au material and which rear surface is plated with Ag material, allowing easy die-bonding and soldering in the form of eutectic.

The post tabs 15a are bonded by solder 3' to one ends of the strip line conductors 18 on the front surface of the ceramic substrate 4. In the illustrated example, since each post tab 15a is made of a Fe-Ni alloy body plated on its front surface with aluminum cladding material and on its rear surface with solder, the post tab allows utilization of ultrasonic bonding of its front surface by means of Al wire and also a good soldering of its rear surface.

The FET chip 14a is wired to the respective post tabs 15a through the aluminum wires 16a by ultrasonic bonding. In FIG. 2, the left-side tab is used as a gate and the right-side tab is used as a drain. In the illustrated FET chip 14a, since heat sink is connected to a source, the heat sink 13a itself becomes a source electrode. Since the heat sink 13a is made of Cu material, the heat sink is electrically connected to the header 11 at the GND potential with a very low source resistance.

In this way, the FET chip 14a is mounted on the header 11 in its bare state and the FET chip 14a and the ceramic substrate 4 are interconnected by means of wire bonding. Such a structure will be referred to as bare chip mounting, hereinafter.

The above module is subjected in a sealing step to a moisture-proof coating with use of phenolic resin and silicone resin and then attached with a resin cap, thus completing a finished product.

The above explanation has been made in connection with an example where the Si-FET bare chips are mounted on the substrate and the header on the bare chip mounting basis. However, when it is desired to mount GaAs-FET chips, a chip carrier package mounting system, which will be explained below, is employed.

An example of an Si bipolar transistor chip carrier is shown in FIGS. 3A and 3B. More specifically, FIG. 3B is a cross-sectional view of the chip carrier taken along line III B—III B in FIG. 3A. Since a bipolar transistor usually has an Si substrate as its collector and is grounded at its emitter, it is necessary to electrically separate or isolated the collector from the ground GND. In addition, since the collector requires much heat radiation, it is necessary to couple the collector to a material having a good thermal conductivity.

To meet such requirements, a chip carrier including a heat sink of beryllia as shown by a plan view in FIG. 3A and by a cross section in FIG. 3B is used. Since beryllia is insulating material and excellent in thermal conductivity, it has been long employed in such applications.

The chip carrier of FIGS. 3A and 3B includes a beryllia material 30, a printed base electrode 31, a printed collector electrode 32, a printed grounding (emitter) electrode 33, a base lead 34, a collector lead 35, an emitter tab 36, an Au-Si eutectic material 37, an Si-bipolar transistor chip, 38 and Au wires 39.

Shown in FIGS. 4A and 4B is an exemplary GaAs-FET chip carrier. More specifically, FIG. 4B is a cross sectional view of the chip carrier taken along line IV B—IV B in FIG. 4A. Since the substrate of a GaAs FET is made of semi-insulating material, a source bonding pad is connected in series by means of bonding wires 51 as shown by a plan view in FIG. 4A and also electrically connected to a heat sink 42. The heat sink 42 is made of Cu or the like metallic material for the purpose of attain a source grounding as shown by the cross section in FIG. 4B. Electrical isolation between the heat sink 42 and a gate lead 48 or a drain lead 47 is established by means of an electrically substrate 41. A GaAs chip substrate 50, which is unsuitable in eutectic die-bonding, is die-bonded by means of low-temperature Au-Ge brazing material 49.

The chip carrier of FIGS. 4A and 4B further includes a printed gate electrode 43, a printed drain electrode 44, a printed source electrode 45, source leads 46, and the Au wires 51.

In the foregoing, explanation has been made in the connection with the ceramic chip carriers for both Si bipolar transistor and GaAs FET. Both ceramic chip carriers are plated with Au material to provide an improved bonding property.

A package of an Si insulated gate FET for high frequency power amplification is known as shown in FIGS. 5A and 5B (for example, refer to JP-A-57-178370 laid open on Nov. 2, 1982). In more detail, FIG. 5B is a cross section of the package taken along line V B—V B in FIG. 5A. However, a heat sink 61 is structurally designed so as to be fixed to a heat radiating plate or a printed circuit board by screwing means. For this reason, the heat sink is suitably mounted onto a flat substrate without any through holes. Mounting of the heat sink to the ceramic substrate of such a module 1 as shown in FIG. 1 is disadvantageous in many respects including a space inefficiency because the heat sink must be inserted into a through hole in the ceramic substrate and then connected to the header by soldering. The package of FIGS. 5A and 5B includes a header 62, a chip 63, leads 64, 65 and 66, a source electrode 67, wires 68, a gate electrode 69, a drain electrode 70, and a resin coat 71.

Explanation will next be made as to mounting of a chip provided with a ceramic chip carrier. Referring to FIG. 6, there is shown, in cross section, a state in which an Si bipolar transistor provided with such a ceramic chip carrier as shown in FIGS. 3A and 3B is fabricated into a module. As shown in FIG. 6, the ceramic chip carrier for the Si bipolar translator is connected by the solder 3 to the ceramic substrate 4 and the header 11 and then subjected to a moisture-proof coating with use of silicone resin 52, thus completing a module as a finished produce.

FIG. 7 is a cross-sectional structure of a module into which a GaAs FET package comprising such a ceramic chip carrier as shown in FIGS. 4A and 4B is fabricated. As shown in FIG. 7, the GaAs FET ceramic chip carrier is connected by the solder 3 to the ceramic substrate 4 and the header 11 and then subjected to a moisture-proof coating with use of the silicone resin 52, thus completing a module as a finished product. FIG. 7 shows a state (an area encircled by a circle A in FIG. 7) where the solder 3 has risen up the Au plated side surface of the heat sink of the chip carrier, which can occur during the soldering of the chip carrier to the header 11. Since the Au plated surface has a very good soldering property, the Au plated surface tends to adhere excessive solder which can cause a short-circuit (in the illustrated example, short-circuiting between the gate and source) due to the solder excessively filling the void formed therein.

In the Example of FIG. 6, while the ceramic chip carrier is illustrated without the excessive solder filling the void, thus avoiding a short circuit, a similar trouble as in the above example of FIG. 7 may take place because the surfaces (front and back surfaces relative to FIG. 6) of the heat sink 30 are plated with Au material. Excessive solder can fill the void created therein and cause a short between the emitter (ground) and collector or base and emitter.

Techniques associated with the fabrication of a power MOS FET for high-frequency power amplification are disclosed, for example, in JP-B-45-11775 (published after post-examination on Apr. 28, 1970), JP-B-49-6514 (published after post-examination on Oct. 1, 1974), JP-A-53-68581 (laid open on Jun. 19, 1978) and JP-A-58-137256 (laid open on Aug. 15, 1983).

SUMMARY OF THE INVENTION

The above explanation has been made as to some structures wherein the chips are fabricated into modules according to the bare chip mounting system and the chip carrier package mounting system. The inventors of the present application have examined the aforementioned prior art structures and found problems. The problems common to the structures according to the bare chip mounting and chip carrier package mounting systems are (1) that excess upward extension of solder onto the sides of the heat sink or chip carrier causes a short-circuiting and (2) that, when the solder layer below the heat sink is too thin, since the solder layer cannot accommodate the stress caused by the heat cycles and ON-OFF cycles, the solder can break, causing ineffective heat sinking and electrical connection.

The problem on the bare chip mounting system is that, since the area of the bonding pad is very small, it is technically difficult to measure the module with a high frequency and a large current in the chip state. For example, because a contact impedance (wiring resistance, capacitance and inductance) between the bonding pad of the chip and a terminal of a measuring device becomes large, it is practically impossible to measure its electrical characteristics (e.g., gain, output power, output capacity) with a high frequency and a large current. For this reason, the characteristic yield of the module at the time of its assembling is reduced.

When it is desired to mount the GaAs chip on the bare chip mounting basis, since interconnection between respective parts in the module are effected by means of soldering, the module temperature cannot be increased to a high level and can be increased up to only about 150° C. to ensure the economical and reliable interconnections. For this reason, wire bonding must be carried out together with ultrasonic wave application. The ultrasonic wave application causes no problem when applied to a mechanically strong (in strength) Si chip, but when applied to a mechanically weak GaAs chip, the ultrasonic wave application can crack the GaAs substrate.

Further, in the module fabricated based on the bare chip mounting system, the post tab for wire bonding is as thin as 100–200 μm and is a small plate of about 3 mm × 1 mm and therefore is difficult to handle, which leads to difficulty in automated mounting of the post tab on the ceramic substrate.

Furthermore, the heat sink having a the chip mounted thereon is hard to handle without causing any scars in the chip surface because the chip is in its bare state. It is also difficult to automate the mounting of the heat sink through the through-hole in the ceramic substrate and then mount it on the header.

In the modules based on the chip carrier package mounting system as shown in FIGS. 6 and 7, the leads are not subjected to any such special shaping operation as to suit the interconnection with the conductive pattern on the substrate. Thus, at the time of soldering the leads to the strip lines on the ceramic substrate, a gap between the lead and associated strip line, may form which results in a soldering failure.

It is therefore an object of the present invention to provide a technique which can avoid any short-circuiting caused by an improper soldering or electrically conductive bonding material.

Another object of the present invention is to provide a technique which can prevent solder release of a heat sink caused by ON/OFF cycles and temperature cycles.

Another object of the present invention is to provide a technique which can facilitate different designs of strip lines.

Another object of the present invention is to provide a technique which can easily evaluate electrical characteristics of a chip.

Another object of the present invention is to provide a semiconductor device which can be mounted by automation.

According to one aspect of the present invention, a packaged semiconductor device has a semiconductor wafer chip, electrode leads, connection conductors for interconnecting the chip and the electrode leads, a heat sink block attached to the semiconductor wafer chip and a mold block. The mold block has a first mold block portion for molding the semiconductor wafer chip, electrode leads, connection conductors and a first portion of the heat sink block relatively nearer to the semiconductor wafer chip and a second mold block portion for molding a second portion of the heat sink block relatively farther from the semiconductor wafer chip. The second mold block portion is smaller than the first mold block portion and extends from the first mold block portion so that the mold block, as whole, is "T"-shaped, with the larger first mold block portion forming the horizontal segment of the "T" shape. The second portion of the heat sink block has a surface exposed from the second mold block portion.

According to another aspect of the present invention, an electronic module device has a packaged semiconductor device as stated above, a support plate, an electrically insulating substrate provided on the support plate which has a first surface metallized and a second surface provided with a conductor pattern and has at least one through hole formed therein. The substrate is placed on the support plate with the metallized first surface contacting the support plate. The packaged semiconductor device is mounted on the electrically insulating substrate and the support plate through one of the through holes in the substrate such that end portions of the electrode leads are placed on and are electrically connected to the conductor pattern on the second surface of the electrically insulating substrate and an electrically conductive bonding material layer is interposed between the exposed surface of the second portion of the heat sink block and the support plate. The bonding material layer has a thickness substantially equal to that of the substrate.

BRIEF DESCRIPTION OF THE DRAWINGS

FIG. 1 is a plan view showing a Prior Art example of an electronic device module to which the present invention is related to.

DESCRIPTION OF THE PREFERRED EMBODIMENTS

Figure 1:
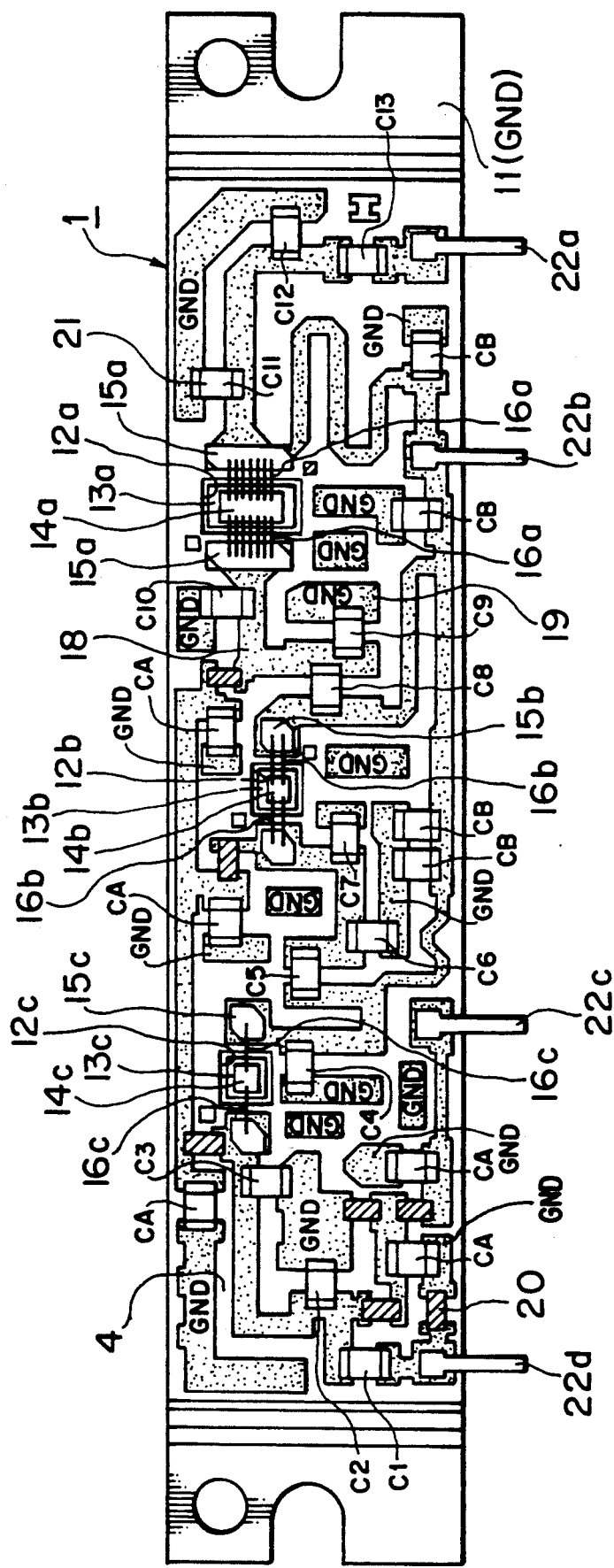

In the attached drawings, parts having the same or equivalent functions are denoted by the same reference numerals and explanation thereof is omitted.

Figure 8A:
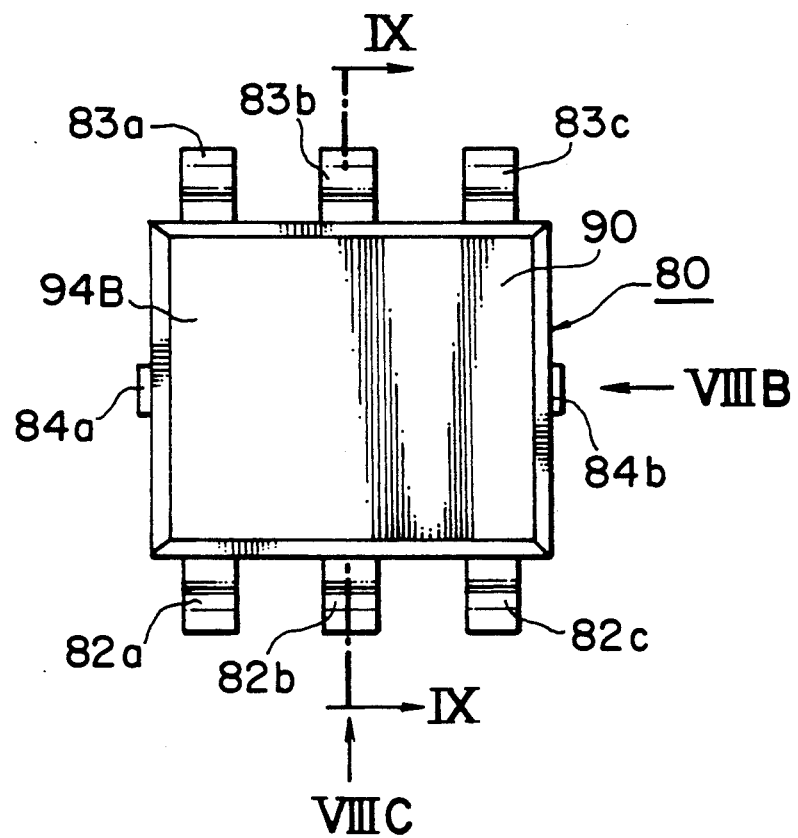
FIG. 8A is a plan view of a packaged semiconductor device in accordance with an embodiment of the present invention.
Figure 8B:
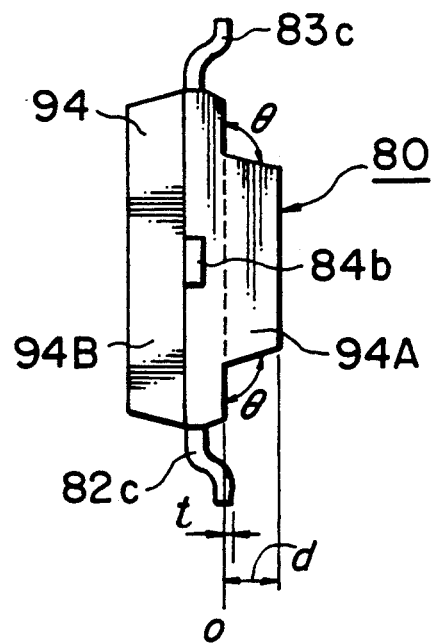
FIG. 8B is a side view of the semiconductor device as viewed from an arrow B in FIG. 8A.
Figure 8C:
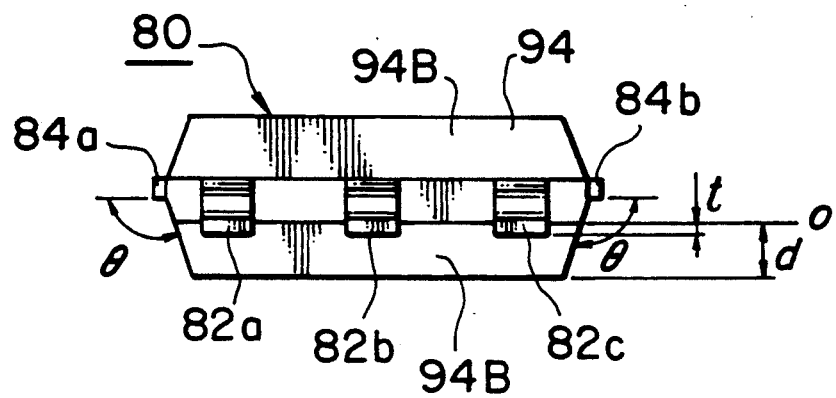
FIG. 8C is a side view of the semiconductor device as viewed from an arrow C in FIG. 8A.
Figure 8D:
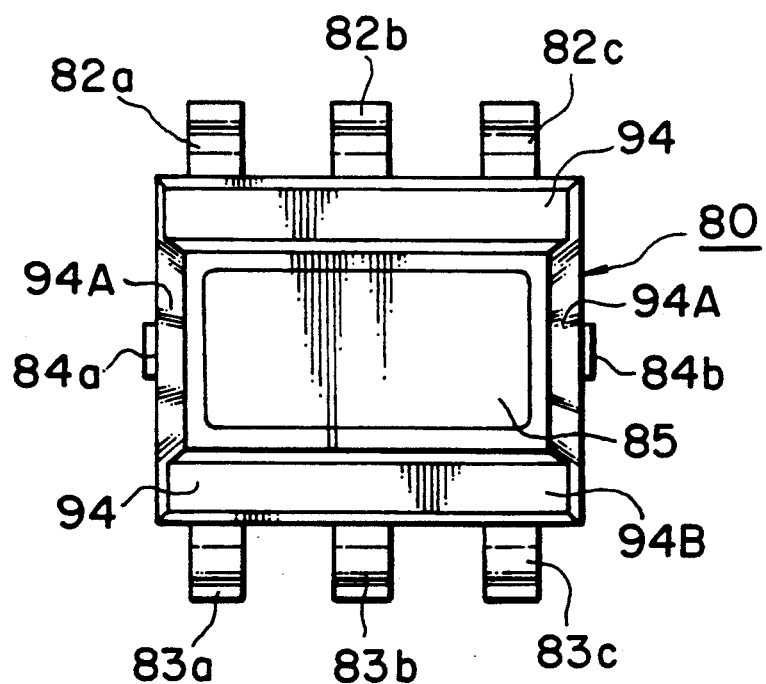
FIG. 8D is a plan view of the semiconductor device as viewed from its rear side in FIG. 8A.
Figure 9:
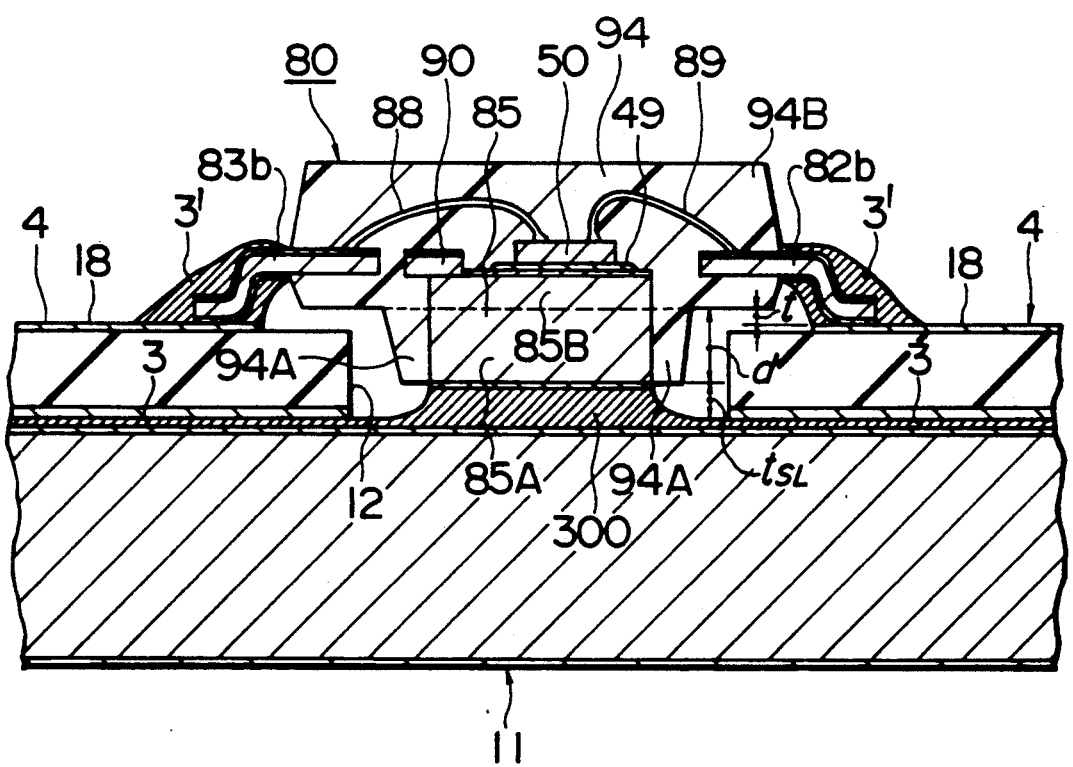
FIG. 9 is a cross-sectional view of an electronic device module into which the packaged semiconductor device of FIGS. 8A to 8D is mounted and which is taken along line IX—IX in FIG. 8A.

FIG. 8A is a plan view of a packaged semiconductor device in accordance with an embodiment of the present invention, FIG. 8B is a side view of the same as viewed from an arrow B (from the surface of its source lead) in FIG. 8A, FIG. 8C is a side view of the same as viewed from an arrow C (from the surface of its drain lead) in FIG. 8A, FIG. 8D is a plan view of the same as viewed from its rear surface (from the surface of its heat sink) in FIG. 8A, and FIG. 9 is a cross-sectional view of the semiconductor device of FIGS. 8A to 8D mounted in a module and taken along line IX—IX in FIG. 8A.

A semiconductor wafer chip comprising a ceramic chip carrier mounted in the module of the present embodiment forms such a resin-molded and packaged semiconductor device as shown in FIGS. 8A to 8D.

Figure 2:
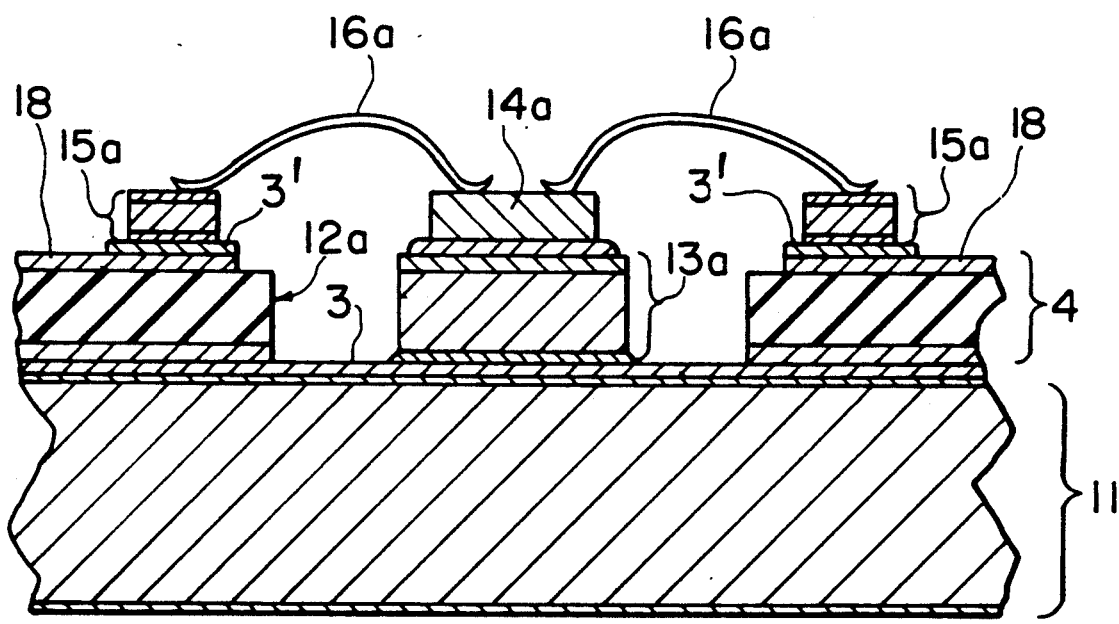
FIG. 2 shows, in cross section, one of semiconductor wafer chips included in Prior Art module of FIG. 1 and a periphery of the wafer chip.
Figure 3A:
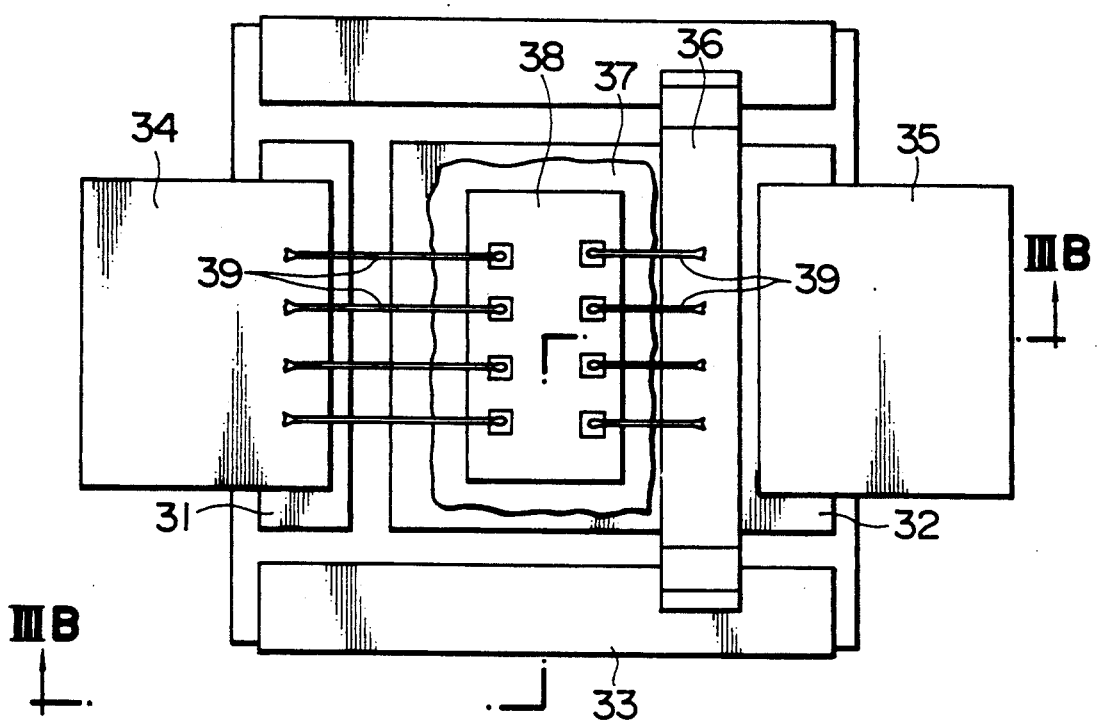
FIG. 3A is a plan view of a Prior Art ceramic chip carrier for an Si bipolar transistor.
Figure 3B:
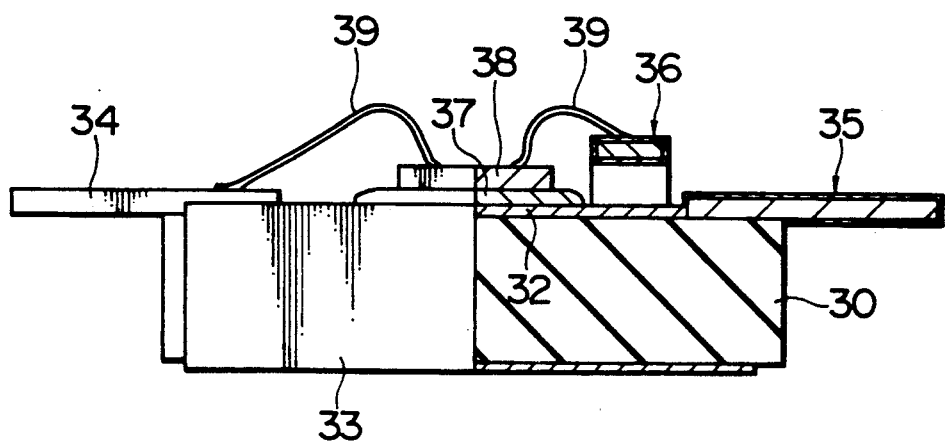
FIG. 3B is a cross-sectional view of Prior Art chip carrier taken along line III B—III B in FIG. 3A.

Referring first to FIG. 9, an electrically insulating substrate 4 is provided on a support plate or header 11 similar to that in FIG. 2 through an electrically conductive bonding material layer 3 such as, for example, a solder layer. A first surface of the substrate 4 opposed to the header is metallized (plated with, e.g., Cu all over the surface) and a second surface of the substrate 4 is formed thereon with conductor patterns 18 and 19 (refer to FIG. 16) including strip line conductors. The substrate is formed therein with at least one through-hole 12.

A packaged semiconductor device as generally represented by 80 comprises a semiconductor wafer chip 50; a plurality of electrode leads including drain leads 82a, 82b and 82c, gate leads 83a, 83b and 83c and source leads 84a and 84b; a plurality of connection conductors or bonding wires 88 and 89 for interconnecting the chip 50 and the electrode leads; a heat sink block 85 attached to the chip 50 and having a first portion 85B relatively nearer to the chip and a second portion 85A relatively farther from the chip; and a molded block 94 made of, for example, resin and having a first mold block portion 94B for molding the chip 50, the plurality of electrode leads 82a, 82b, 82c, 83a, 83b, 83c, 84a and 84b, the connection conductors 88 and 89 and the first portion 85B of the heat sink block 85, and a second mold block portion 85A for molding the second portion 85A of the heat sink block 85.

The second mold block portion 94A is smaller than the first mold block portion and extends from the first mold block portion 94B so that the mold block has, as a whole, is "T"-shaped, with the larger first mold block portion forming the horizontal segment of the "T" shape. The second portion 85A of the heat sink block has a surface exposed from the second mold block portion 94A. Each of the electrode leads 82a, 82b, 82c, 83a, 83b, 83c, 84a and 84b is shaped such that its free end is farther from the chip 50 than the boundary between the first and second mold block portions (refer to "t" in FIG. 8B and FIG. 9).

In FIGS. 8A to 8D and 9, reference numeral 49 denotes an Au-Si eutectic alloy layer for bonding the chip 50 to the heat sink block 85, reference numeral 90 a heat sink block supporting lead, reference "t" the height of the electrode leads (a distance from the boundary between the first and second mold block portions 94B and 94A to the tip end of the electrode lead), reference "d" the thickness of the second mold block portion 94A in the thickness direction of the chip 50, reference "θ" a taper angle of the side surface of the second mold block portion 94A, reference "0" the boundary between the first and second block portions 94A and 94B.

The packaged semiconductor device 80 according to the present embodiment has such a structure that the four side surfaces of the second portion 85A of the heat sink 85 projecting from the first mold block 94B are enclosed by the mold resin (second mold block) 94A as shown in FIGS. 8A to 8D to thereby prevent the solder 3 from being excessively reached upward. The mold resin 94A is set to be extended to the same level as or be slightly above the bottom surface of the second portion 85A of the heat sink block 85. In other words, the heat sink block 85 is covered with the mold resin 94A so that, when the heat sink block 85 is viewed from its surface, the lower part of the block 85 is slightly seen.

With such an arrangement, the mounting portion problem of the semiconductor chip 50 in fabrication of the prior art module, that is, short-circuiting of the module caused by the excessive upward extension of the solder (paste solder) 3 along the surfaces of the heat sink block 85 as one of the common problems in the both bare chip mounting and ceramic chip carrier mounting systems can be substantially avoided.

Further, when the distance (the height "t" of the electrode leads) from the boundary between the first and second mold block portions 94B and 94A to the tip ends of the electrode leads is optimally designed according to the relationship with the thickness of the ceramic substrate 4 (refer to FIG. 9) of the module, another problem in the prior art, that is, poor contact between the bottom surface of the heat sink block 85 and the header 11 of the mold caused by the too-thin solder layer 3 can be substantially eliminated.

In addition, the lead frame is structured so that the gate leads 83a, 83b and 83c and the drain leads 82a, 82b and 82c can be extruded from the package, whereby unnecessary lengths of the leads can be easily cut off leaving suitable lengths of the leads matching to the conductor pattern on the substrate. That is, its pattern design can be facilitated. With such an arrangement, the design of the ceramic substrate of the module, in particular, the design of its small-size and high-performance pattern can be facilitated.

In the present embodiment, the measurement of characteristics with use of high frequency and large current, which has been a problem in the prior art bare chip mounting system, can be contemplated because the present embodiment is based on the chip carrier system. Further, the GaAs FET chip mounting problem, in the bare chip mounting system can be contemplated, because the present embodiment is based on the chip carrier package mounting system and sufficient heat application can be carried out in thermocompression bonding at above 300° C. in another step apart from the module body. Furthermore, the poor workability of mounting on the ceramic substrate 4 resulting from the bare chip system, that is, the difficulty in automated mounting, can be completely eliminated because the present embodiment is based on the chip carrier package mounting system. Moreover, the moisture-proof measure can be coped with by exposing only the bottom surface of the heat sink block 85 to provide a relatively long path for the moisture to travel from the boundary of the lead frame and the resin which is and by employing the transfer mold resin excellent in bonding property with respect to the lead frame.

Figure 10A:
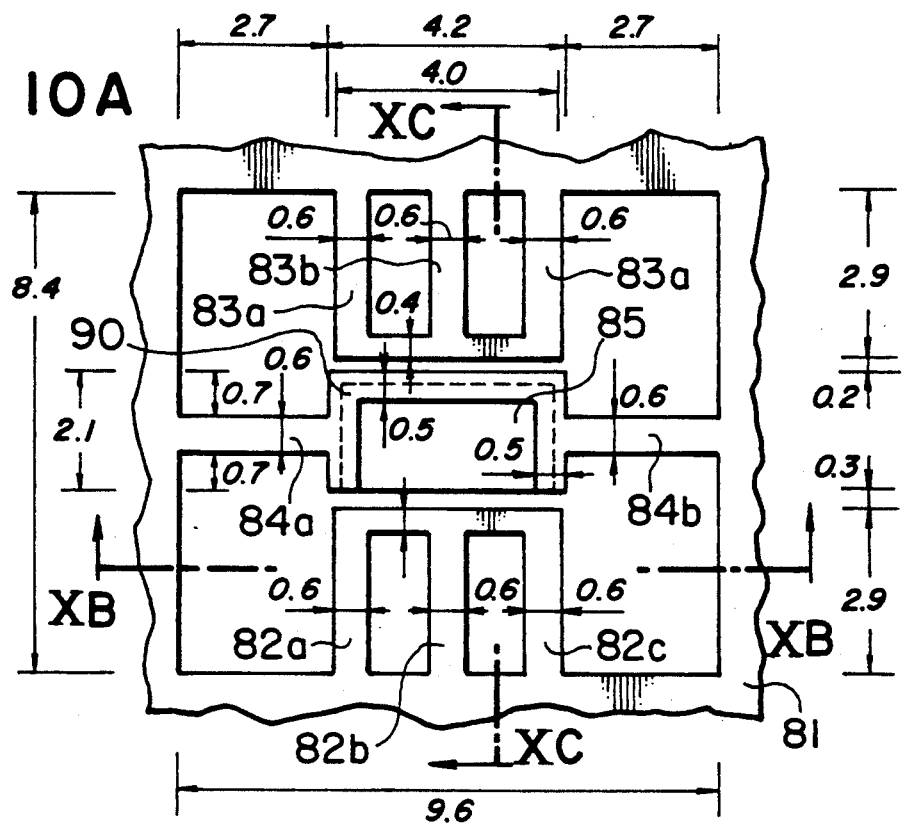
FIG. 10A is a plan view of a major part of a lead frame for the packaged semiconductor device in accordance with an embodiment of the present invention.
Figure 10B:
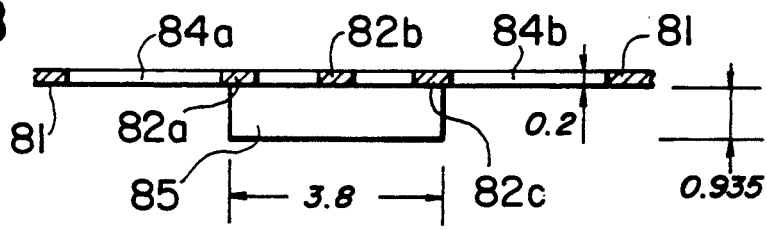
FIG. 10B is a cross-sectional view of the lead frame taken along line X B—X B in FIG. 10A.
Figure 10C:
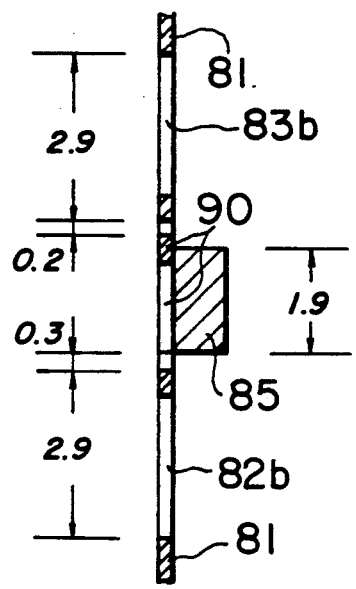
FIG. 10C is a cross-sectional view of the lead frame taken along line X C—X C in FIG. 10A.

FIG. 10A is a plan view of a major part of a lead frame used in fabrication of the packaged semiconductor device in accordance with the embodiment of the present invention, FIG. 10B is a cross-sectional view of the lead frame taken along line X B—X B in FIG. 10A, and FIG. 10C is a cross-sectional view of the lead frame taken along line X C—X C in FIG. 10A. In FIGS. 10A, 10B and 10C, reference numeral 81 denotes a peripheral lead and reference numeral 90 a heat sink block supporting lead.

The lead frame, as shown in FIGS. 8A, 8B and 8C, includes an electrode lead portion as a relatively thin plate portion and a heat sink block portion as a relatively thick plate portion. The numerical values showing lengths and thicknesses are in mm.

The heat sink block 85, which is made of preferably Cu material or alloy containing Cu which is excellent in thermal conductivity, is made by pressing into a predetermined size and then tempering to provide a sufficiently low hardness. Because of its low hardness, the heat sink block 85 can be easily plastically deformed. Even when the heat sink block is die-bonded to the chip in the form of Au-Si eutectic (usually at about 430° C.) and then returned to normal temperature, if the thermal expansion coefficient difference between the heat sink block and the chip causes the chip to crack, the heat sink block 85 may be made of another metal having a thermal expansion coefficient close to that of Si or ceramics (for example, Cu-W alloy, covar, Fe-Ni alloy, conductor-printed (metallized) beryllia block, or high termal conduction ceramics such as Al-N or Si-C. Of these materials, the Cu material is most advantageous from the viewpoint of its cost. However, when it is desired to mount a relatively large size chip (e.g. 3 mm×3 mm in square), materials other than the Cu material are preferable. The thickness of the heat sink block 85 is determined according to a design technique to be explained later.

The electrode lead portion in the lead frame is made of Cu-material plate of, e.g., about 0.1–0.3 mm thick (not restricted only to the Cu material but preferable for high frequency circuits because of its low resistance and non-magnetic property). The electrode lead portion comprises, as shown in FIGS. 10A, 10B and 10C, drain lead portions 82a, 82b and 82c, gate lead portions 83a, 83b and 83c, source lead portions 84a and 84b, the heat sink block supporting lead portion 90, and the peripheral lead portion 81.

The electrode lead portion can be precisely processed by etching or pressing with an accuracy as high as several hundreds of microns because of its thin plate. However, when it is desired to bond the heat sink block 85 to the heat sink block supporting lead 90 of the lead frame (by silver soldering material, high melting-point solder, spot welding or the like), variations in the relative mounting positional relationship between the both result in a large tolerance. For the purpose of avoiding this, the heat sink block supporting lead 90 is designed to be larger than the heat sink block 85. For this reason, even when the relative mounting positional relationship varies greatly, undesired short-circuiting or die scoring at the time of molding can be avoided. (The molding die is designed to match the contour line of the heat sink block supporting lead 90.)

Figure 4A:
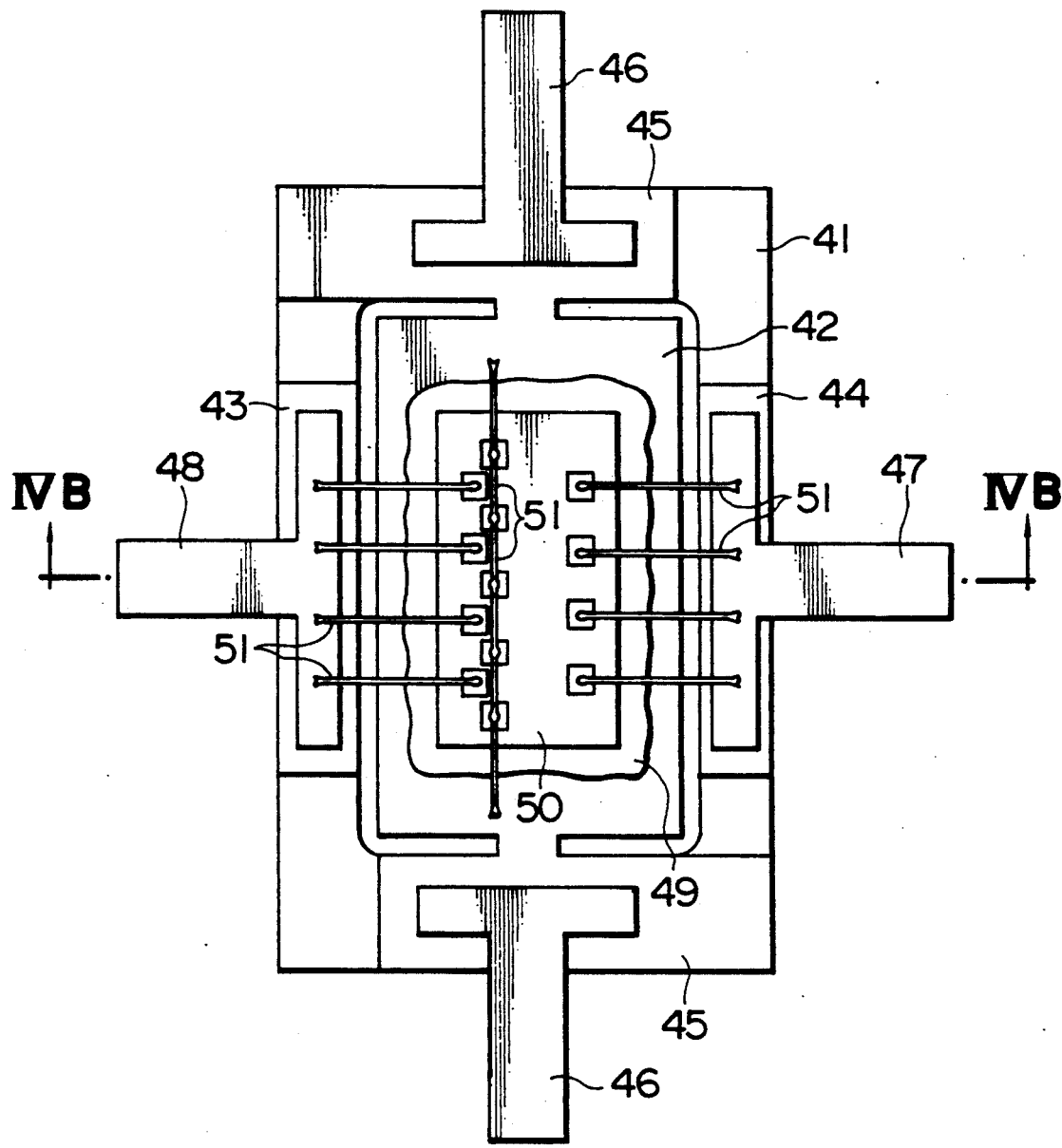
FIG. 4A is a plan view of a Prior Art ceramic chip carrier for a GaAs FET.
Figure 4B:
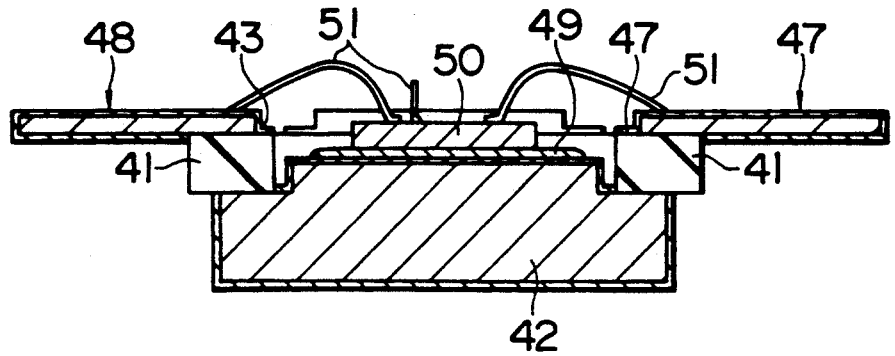
FIG. 4B is a cross-sectional view Prior Art chip carrier taken along line IV B—IV B in FIG. 4A.
Figure 5A:
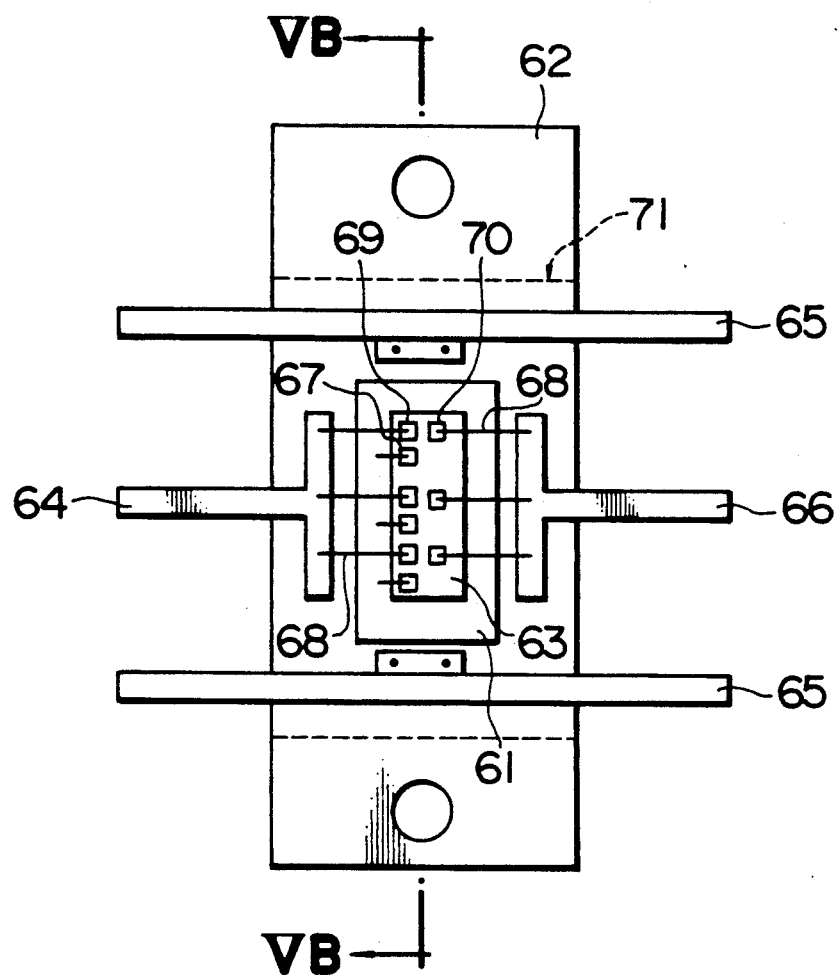
FIG. 5A is a plan view of a Prior Art package for the Si-MOS FET.
Figure 5B:
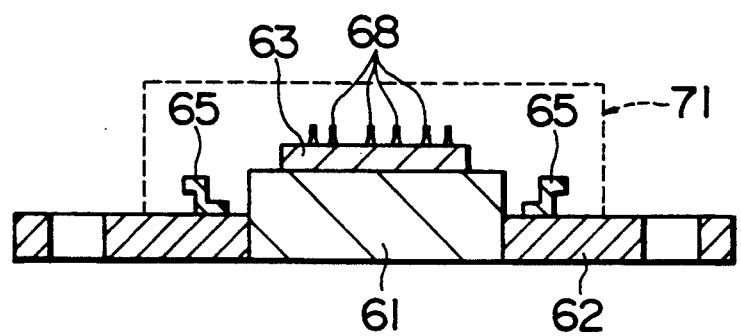
FIG. 5B is a cross-sectional view of the Prior Art package taken along line V B—V B in FIG. 5A.
Figure 6:
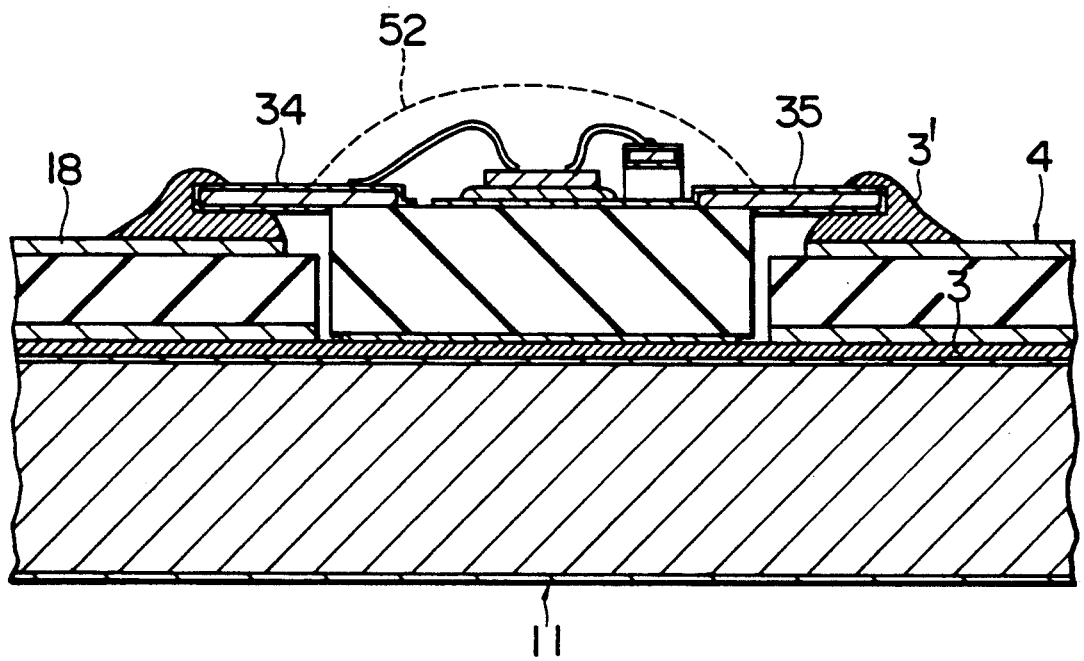
FIG. 6 is a cross-sectional view of Prior Art electronic device module into which a ceramic chip carrier package for a Si bipolar transistor is mounted.
Figure 7:
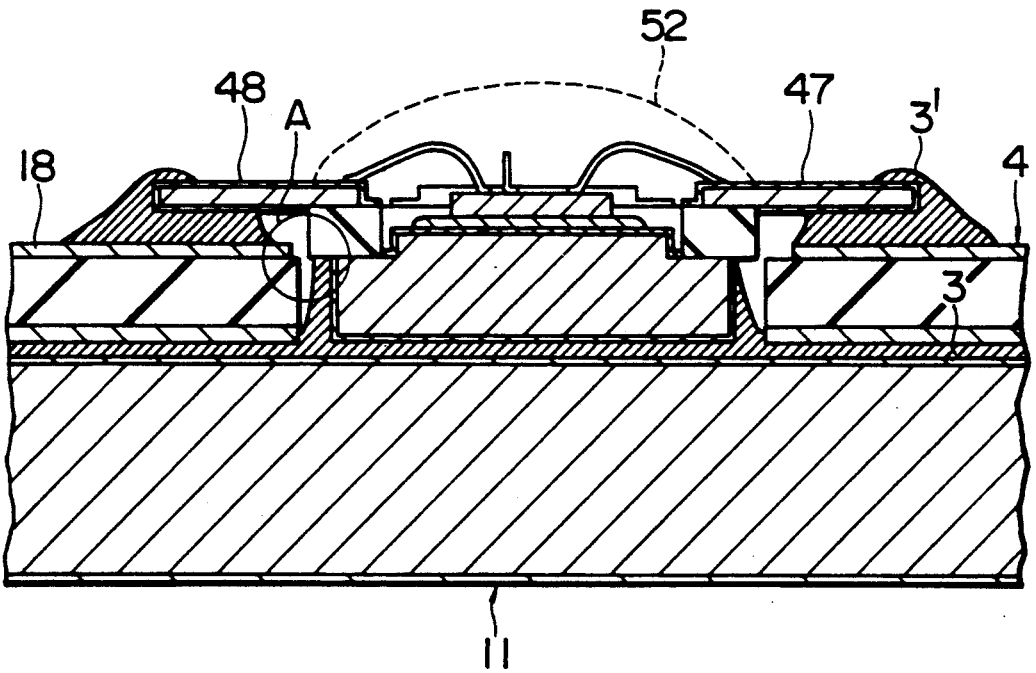
FIG. 7 is a cross-sectional view of Prior Art electronic device module into which a ceramic chip carrier package for a GaAs FET is mounted.
Figure 11:
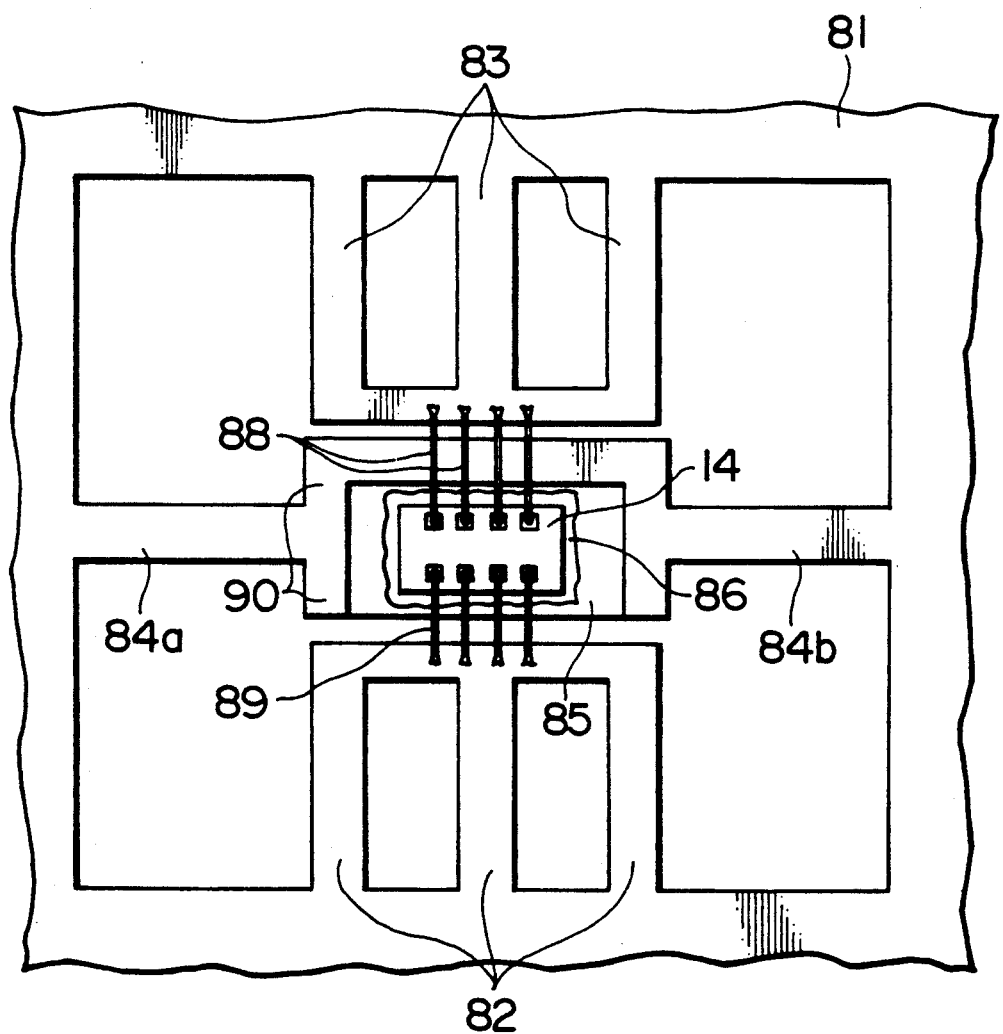
FIG. 11 is a plan view of a chip carrier lead frame for the packaged semiconductor device in accordance with an embodiment of the present invention, showing the shapes of the lead frame and Si FET chip and a relative array therebetween.
Figure 12:
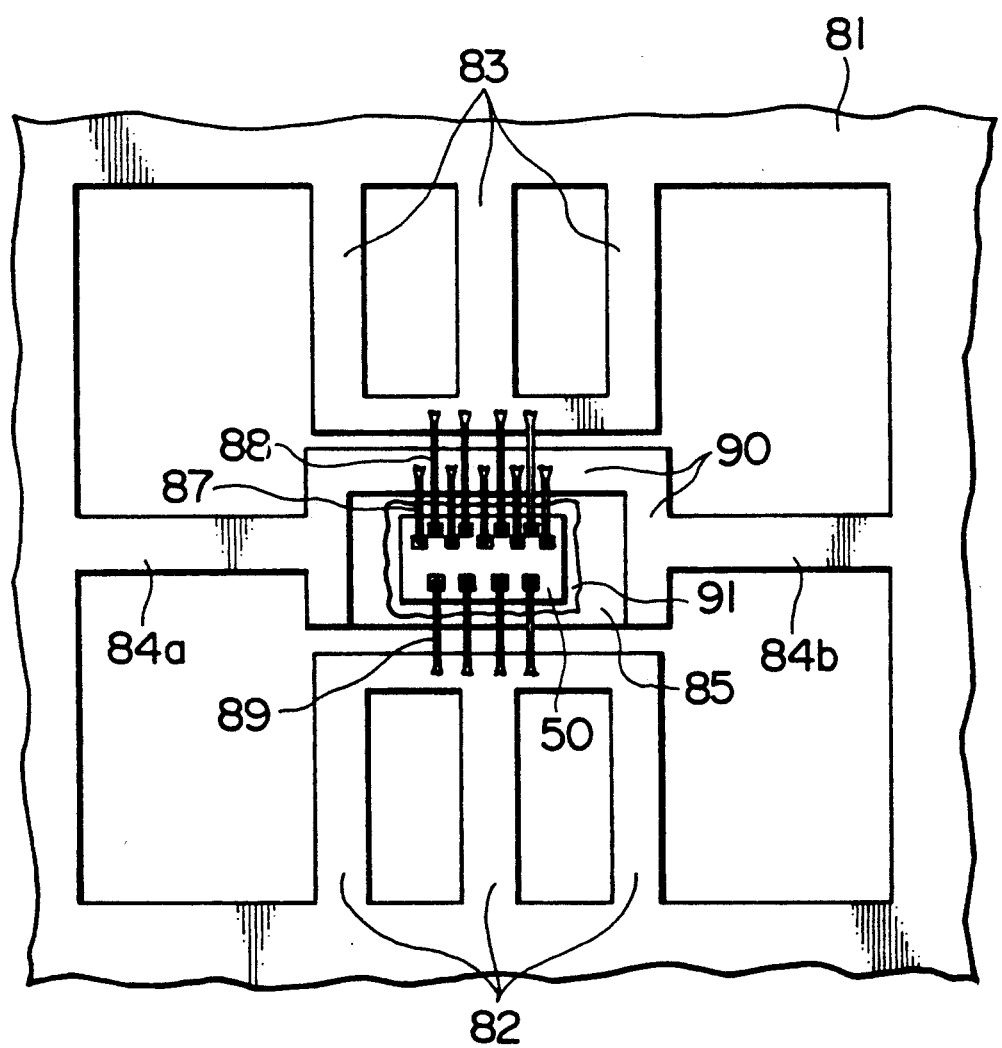
FIG. 12 is a plan view of a chip carrier lead frame for the packaged semiconductor device in accordance with an embodiment of the present invention, showing the shapes of the lead frame and a GaAs FET chip and a relative array therebetween.

The heat sink block supporting lead 90, as shown in FIGS. 11 and 12, functions to mount thereon the heat sink block 85 and also as a source bonding tab at the time of mounting the Ga-As FET chip 50. That is, the heat sink block supporting lead 90 is a chip carrier which mounts thereon either of the Ga-As FET chip 50 and the Si FET chip 14. Further, the bonding area necessary for source bonding wires 87 is positioned to be parallel to the source electrode pad array of the chip 50 as shown in FIG. 12. It will be seen that the plurality of source bonding wires 87 can be wired in parallel as shown in FIG. 12, in contrast to the prior art ceramic chip carrier (refer to FIG. 4A). As a result, the impedance (which contribute to power loss and performance) of the bonding wires 87 can be reduced more than that of the series bonding of FIG. 4A, especially when this lead frame is used in a module handling high frequencies and large currents.

Meanwhile, the heat sink block supporting lead 90 and the heat sink block 85 define a step (refer to FIG. 9) therebetween. This step advantageously acts to prevent such poor bonding that, at the time of die-bonding the chip, the solder (such as Au-Ge or Au-Sn) for the die-bonding melts and flows as diffused and attached to the wire bonding portions. That is, the flowing solder tends to stop at that step due to the so-called surface tension at that step.

In FIGS. 8B and 9, the projection length "d" of the second heat sink block 94A extending from the boundary surface "0" between the first and second mold block portions 94B and 94A is designed to be substantially equal to or slightly larger (for example, larger by about 50 μm) than the thickness of the ceramic substrate 4. When the taper angle θ is set to be more than 90 degrees, advantageously mold release at the time of transfer molding can be enhanced and the semiconductor device can be smoothly inserted into the through hole 12 in the ceramic substrate 4 (refer to FIG. 9). The lead height "t" can be calculated in accordance with the equation set forth below with a solder thickness $t_{sL}$ secured in FIG. 9.

In this case, the packaged semiconductor device 80 is passed through the through hole 12 and mounted on the electrically insulating substrate 4 and also on the header so that one end of the electrode leads 82b is placed substantially on and as electrically connected to the conductor pattern 18 formed on the second surface of the electrically insulating substrate 4 and also on a bonding material layer (such as a solder layer) 300 disposed between the exposed surface of the second block portion of the heat sink block 85 and the header (support plate) 11.

Lead height "t" (designed value)=Thickness "d" of second mold block 94+Thickness "$t_{sL}$" of solder layer 300−Thickness of ceramic substrate 4.

In the illustrated example, since the thickness of the heat sink block is substantially equal to or larger by α (about 50 μm=0.05 mm) than the thickness of the ceramic substrate, the following equation is satisfied:

Lead height "t"≃Thickness "$t_s$" of solder layer 300 (+α=about 0.05 mm as necessary).

Explanation will next be made to assembling the electronic device module. As shown in FIG. 9, the paste solder 300 is previously printed on the surface of the header 11, the ceramic substrate 4 on the second surface of which such parts as chip capacitors are temporarily disposed by means of the viscosity of the paste solder 3 is placed on the header 11, and the packaged semiconductor device 80 is passed through the through hole 12 of the ceramic substrate and mounted thereon. Since the respective parts are temporarily set by means of the viscosity of the paste solder, they can be positively shifted to the next step without falling down.

In the next step, the above assembly is heated on a heat block or a belt furnace to melt the solder 3 and 300 and weldingly connect these parts. At this time, a suitable load and vibration are applied to the ceramic substrate 4 by known means to ensure the solder interconnection of the rear surface of the ceramic substrate 4 and the header 11, and to expel flux from the paste solder 3. Thereafter, the applied load and vibration is removed and the assembly are cooled to solidify the solder, at which stage the soldering work is completed.

As will be seen from the foregoing explanation, in the packaged semiconductor device in accordance with the present embodiment, even when the quantity of solder 3 is insufficient for example, the load applied during the melt state of the solder (paste solder) 3 causes the ceramic substrate 4 to be pushed toward the header 11, so that the solder 3 raises from the through hole, thereby ensuredly being brought into contact with the bottom surface of the heat sink block 85 at the bottom surface of the mold block 94. Since the bottom surface of the heat sink block 85 is plated thereon with the solder having a good solderability, the solder on the bottom surface of the heat sink block is alloyed with the melted solder 300, whereby a very good solder bonding can be attained between the heat sink block and the header 11. At this time, the electrode lead solder 3' is also melted and alloyed with the plated solder of the electrode leads (82 and 83). Next, the load and vibration applied to the ceramic substrate 4 are released so that the ceramic substrate 4 flows up under the influence of the surface tension of the solder 300 on the header 11 in such a manner that the printed paste solder has a thickness corresponding to its quantity. At this time, the solder 300 raised through the ceramic through hole is guided into the bottom of the ceramic substrate 4, while the molten solder contacting on the surface of the heat sink block exposed from the second mold block portion 94A acts, under the influence of its surface tension, to pull the device 80 toward the header 11 to thereby have such a shape as shown in FIG. 9. Thus, the electrode leads (82 and 83) are pushed against the surfaces of the strip line conductors 18 of the ceramic substrate 4. This pushing force is maintained until the solder 3 is solidified or set and thus enables positive soldering of the electrode leads (82 and 83). It will be appreciated from the above explanation that the solder 300 can surely have the thickness $t_{sL}$ corresponding to its minimum necessary quantity and lead contact failure caused by the floating of the electrode leads (82 and 83) can be avoided.

In this way, in accordance with the present invention, even in the case where the quantity of solder 3 between the ceramic substrate 4 and the header 11 is insufficient, the heat sink block 85 can be prevented from being released when subjected to heat cycle, unlike the prior art ceramic chip carrier package mounting system or bare chip mounting system.

Since the input/output impedances of high frequency module are usually prescribed to be respectively 50 Ω, in order to attain matching to the input/output impedances of amplification semiconductor device, the conductor pattern design of the high frequency module is carried out to form a matching circuit which comprises a combination of chip capacitors and/or resistors in the form of micro-strip conductor lines. However, in the case of a small-sized module design, attention must be paid to the acquisition of a sufficient length of conductor strip line and the separation between high frequency current input and output lines.

In the case where the occupation area ratio of the semiconductor device in the module is very high and the electrode leads of the semiconductor device are disposed in its center, strict restrictions are placed on the conductor pattern design. Therefore, in the recent pattern design of a module demanding a smaller size and a higher performance, the acquisition of only 1-2 mm length of pattern often requires much difficulties.

However, since the electronic device module of the present embodiment has a flexibility in the drawing position of the electrode leads which will be explained later, the present invention can contribute greatly to the acquisition of a smaller size, higher performance module.

Explanation will then be made to the manufacture of the lead frame. As shown in FIGS. 10A, 10B and 10C, a thin plate of, e.g., 0.2 mm thick made of Cu material or alloy containing Cu is first etched or pressed to obtain a predetermined shape (about 16×114 mm for 9 semiconductor devices) (for its general view, refer to FIG. 13).

With respect to the heat sink block 85, a suitable starting block is pressed into a block measuring 1.9×3.7 mm and about 1 mm in thickness. Thereafter, the obtained block is heated at a high temperature (in an inactive atmosphere) to be tempered. The heat sink block 85 thus obtained is welded to that part of the aforementioned lead frame corresponding to the heat sink block supporting lead 90 by silver soldering (or by high temperature solder or by spot welding). Then the assembly is plated with Ag all over the surface (or may be partially plated with Ag only with regard to its front surface, chip die-bonding portion and wire bonding portion, or may be plated with Au), thus completing a finished lead frame.

Explanation will next be made made to assembling an Si FET by referring to FIG. 11. An Si FET chip may be die-bonded in the form of eutectic. Die-bonding is carried out by placing Au material on that part of the heat sink block 85 of the lead frame corresponding to the chip mounting location, by heating the frame to about 430° C., by mounting the Si FET chip 14 on the Au material and then by applying a load and vibration thereto with a known means. Next, by using a wire bonding apparatus, the thus obtained assembly is heated to about 330° C., and the drain wires 89 and gate wires 88 as Au wires having a diameter of 20 μm are bonded to the bonding pads of the chip 14 by a nail head bonding technique. In this connection, it goes without saying that the wire bonding may be carried out by an Au-wire thermosonic bonding technique.

Explanation will next be made to assembling a GaAs FET chip with reference to FIG. 12. Since the GaAs FET chip 50 cannot employ the AuSi eutectic die-bonding method, die-bonding using the soldering material 91 such as Au-Ge or Au-Sn is used instead. This method is substantially the same as for the Si FET, except that the heating temperature is about 380° C. (which temperature may be lower than 380° C. when the Au-Sn is used. Further, the die-bonding may be carried out with such bonding agent as Ag paste (in this case, hardening is required), but it is especially unnecessary for the agent to be electrically conductive.

Next, wire bonding is carried out. As the wire bonding, the nail head bonding is preferably employed with respect to the Au wires 87, 88 and 89 at about 330° C. The thermosonic bonding technique and the ultrasonic bonding technique (for Al wires) are unsuitable, since the techniques cause ultrasonic wave energy to be applied onto the mechanically weak GaAs surface, which imposes strict restrictions on the bonding conditions. As in the Si FET chip 14, wire bonding is carried out, in addition to the gate and drain wires 88 and 89, between the source wires 87 and the heat sink block supporting lead 90 by the number of source electrode pads of the GaAs FET chip 50.

Figure 13:
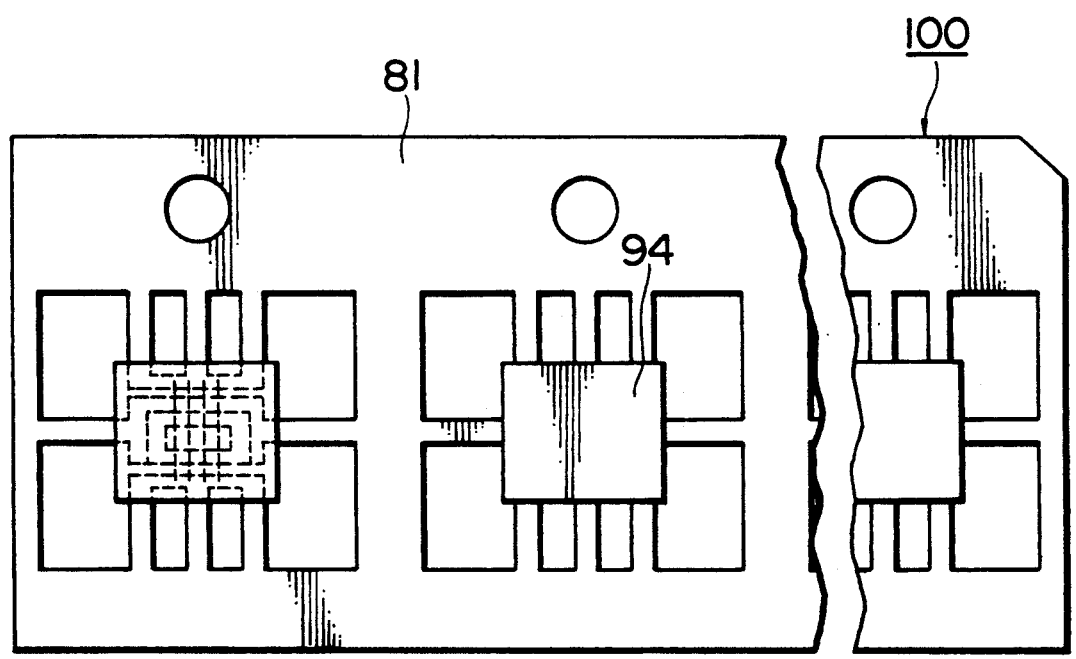
FIG. 13 is a plan view of the entire configuration of a lead frame in accordance with an embodiment of the present invention, showing a state after molding is completed.
Figure 14A:
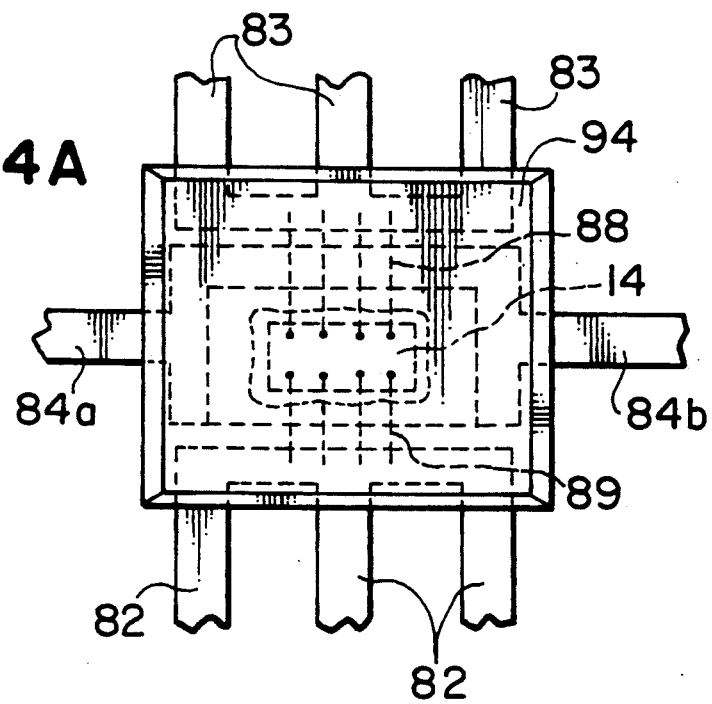
FIG. 14A is a plan view of a molded part in FIG. 13 as magnified.
Figure 14B:
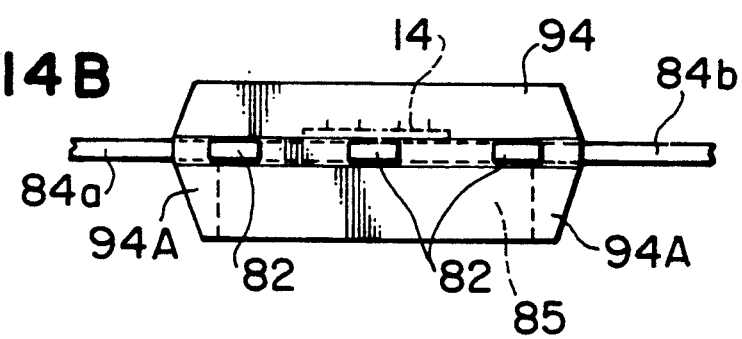
FIGS. 14B and 14C are side views of the molded part as viewed from different directions, respectively.
Figure 14C:
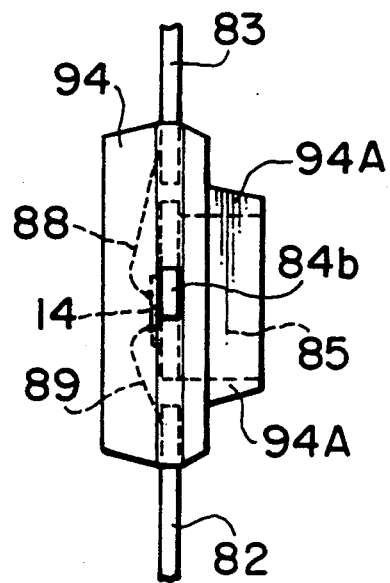

Next, how to mold the above assembly (having the Si FET or GaAs FET chip 14 or 50 mounted thereon) will be explained. The assembly is subjected to a molding operation for example, a transfer molding operation. The semiconductor chip thus molded, i.e., a packed semiconductor device is shown as an example, in FIGS. 13, 14A, 14B and 14C. More specifically, FIG. 14B is a side view of the packed semiconductor device of FIG. 14A as viewed from its drain lead surface, and FIG. 14C is a side view of the packed semiconductor device of FIG. 14A as viewed from its source lead surface. The mold resin have outer dimensions of, for example, 4.0 mm×4.8 mm×1.9 mm. In FIG. 13, reference numeral 100 denotes a lead frame.

An assembly thus molded is subjected to a resin fin removing operation by a bluster technique or a chemical technique and then to a solder plating operation. Through the solder plating operation, the electrode lead and the exposure surface of the heat sink block are completely plated with solder (preliminary soldering).

Then an assembly thus solder-plated is cut off with use of a cutting die at each peripheral lead 81 into separate products with the lead length necessary for the later selection operation left.

Products thus cut off are subjected to the selection operation with respect to DC and high frequency items and as necessary, to a characteristic classifying operation. (Since a suitable length of the electrode lead allows a good electrical contact with a terminal of a measuring apparatus in the selection operations, the source lead is cut to a suitable length in the aforementioned cut-off step.)

The products subjected to the selection operation are then subjected to a marking operation of model type, etc., by imprinting or laser marking. The marking operation may be carried out after the molding step and before the selection step. When it is desired to give characteristic classification marks, such marking is carried prior to the selection step from the viewpoint of efficiency.

Thereafter, the products thus marked are shaped and cut to have respectively a predetermined lead shape. That is, the source leads 84a and 84b are cut off to obtain such a packaged semiconductor device 80 as shown in FIGS. 8A to 8D as a finished product. In this connection, in some applications, desired one of the gate leads 83a, 83b and 83c and desired one of the drain leads 82a, 82b and 82c may be left on the gate and drain surfaces respectively and the other leads may be cut off as necessary. Further, in some applications, unnecessary ones of these leads may be advantageously cut off according to the demand of module manufacturer who fabricates modules using the packaged semiconductor devices of the present embodiment.

Figure 15A:
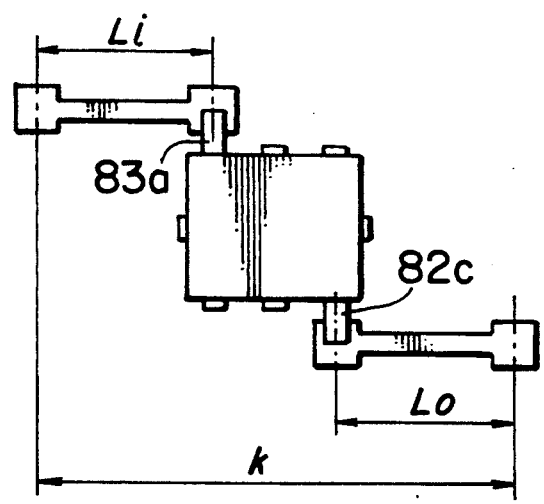
FIGS. 15A, 15B and 15C are plan views showing different relationships between the lead wiring and strip line length of the chip carrier of the embodiment of the invention, respectively.
Figure 15B:
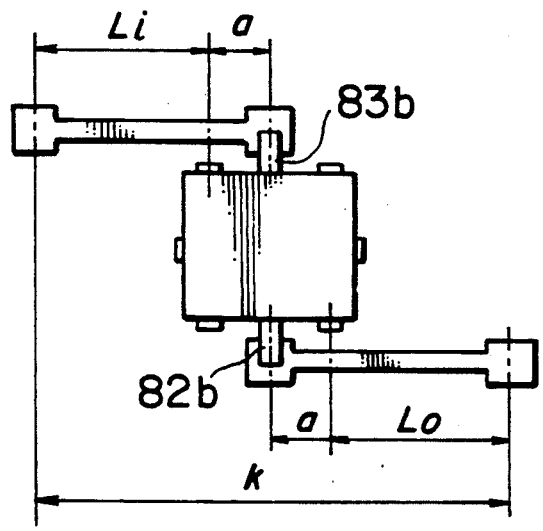
Figure 15C:
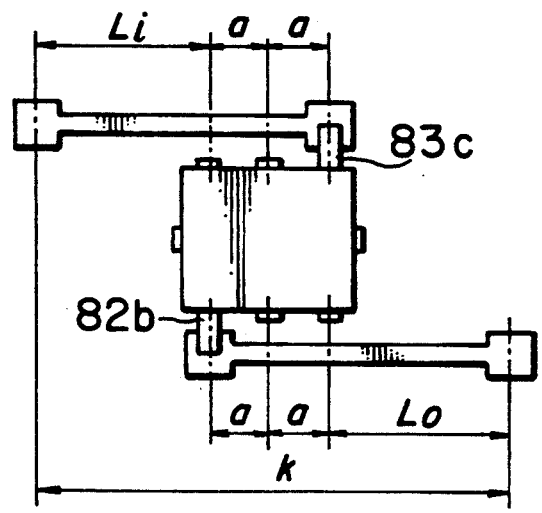

Explanation will next be made as to the flexibility of strip line conductor design in the electronic device module. As shown in FIGS. 15A, 15B and 15C, the strip line conductor design of the present invention is high in its flexibility. For example, when an electrode lead pitch "a" is set to be 1.7 mm, input and output line lengths Li and Lo become respectively 3.4 mm and thus its flexibility becomes 6.8 mm corresponding to a sum of the input and output line lengths. Accordingly, the strip line length of 1-2 mm, in which shortening requires much difficulties at the time of designing a small size module, can be easily realized. FIGS. 15A, 15B and 15C show basic examples of the electrode lead array showing various combinations. When necessary, it is also possible to connect the source leads onto the ceramic substrate. The electrode lead array may be freely modified in the cut-off step of package manufacturer surface according to module manufacturer's request. Further, the packages with all the leads not cut off may be supplied to the module manufacturer and the module manufacturer may modify the lead array to desired one for flexible management of the high frequency characteristics of the module.

Based on the present disclosure, the method of manufacturing the module using the package of the present invention can be contemplated using known technology. Since the package of the present embodiment is fully resin-molded, a taping system advantageous in automation can be employed.

Figure 16:
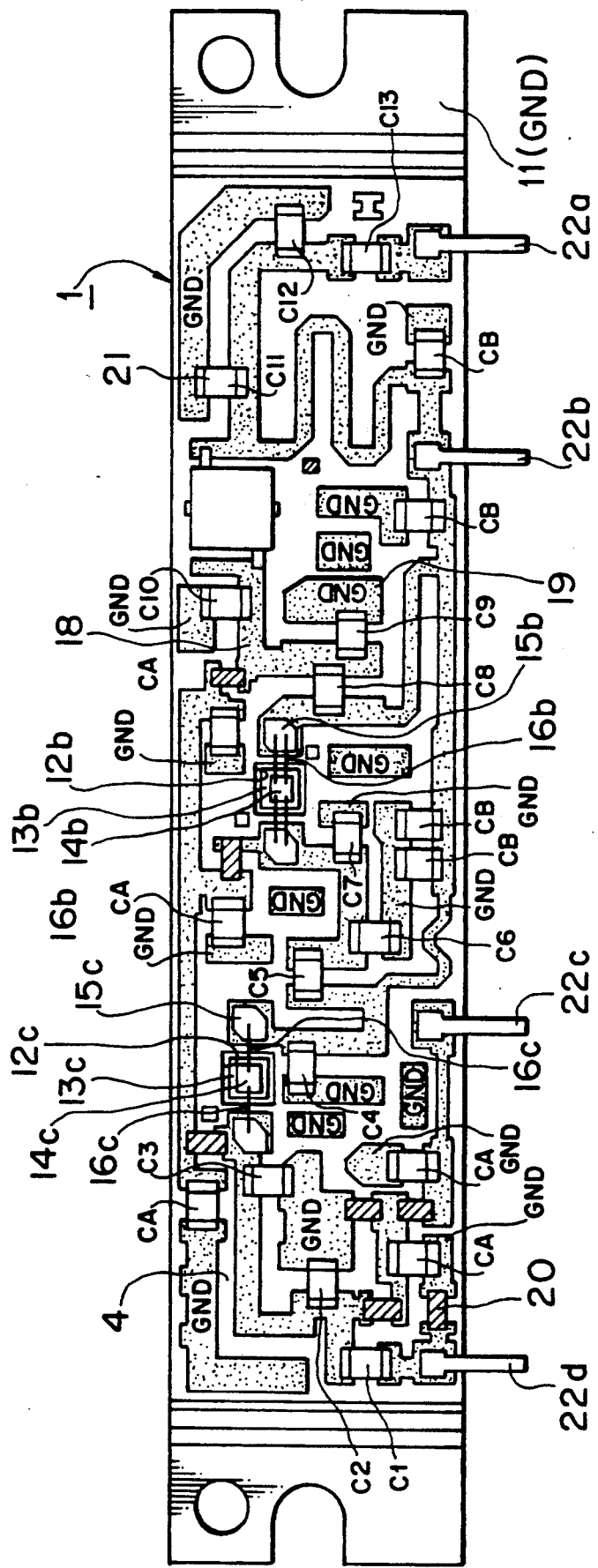
FIG. 16 is a plan view of an electronic device module in accordance with an embodiment of the present invention.

Shown in FIG. 16 is a plan view of an electronic device module having the packaged semiconductor device of FIG. 14 mounted thereon. It will be seen from the above explanation that the strip line conductor design of the present invention is more flexible than the prior art.

Figure 17:
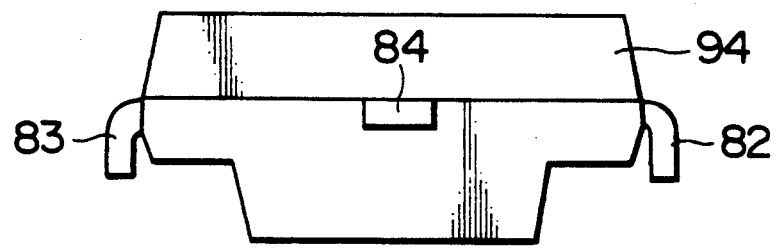
FIGS. 17, 18 and 19 are side views of the packaged semiconductor devices of different embodiments having differently molded electrode leads, respectively.
Figure 18:
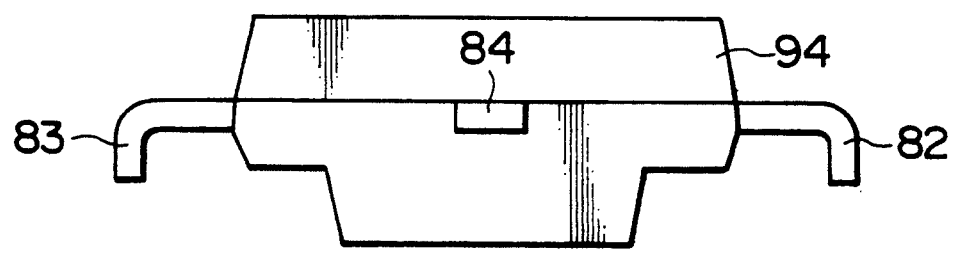
Figure 19:
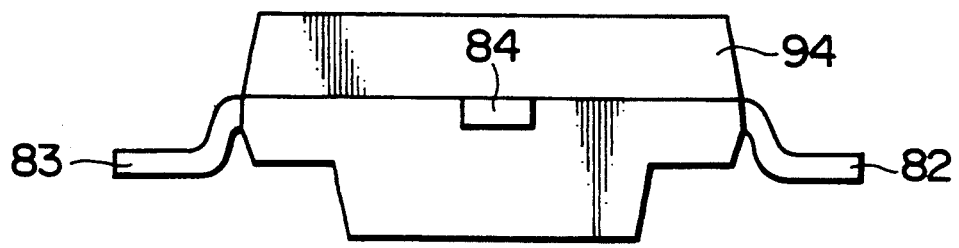
Figure 20:
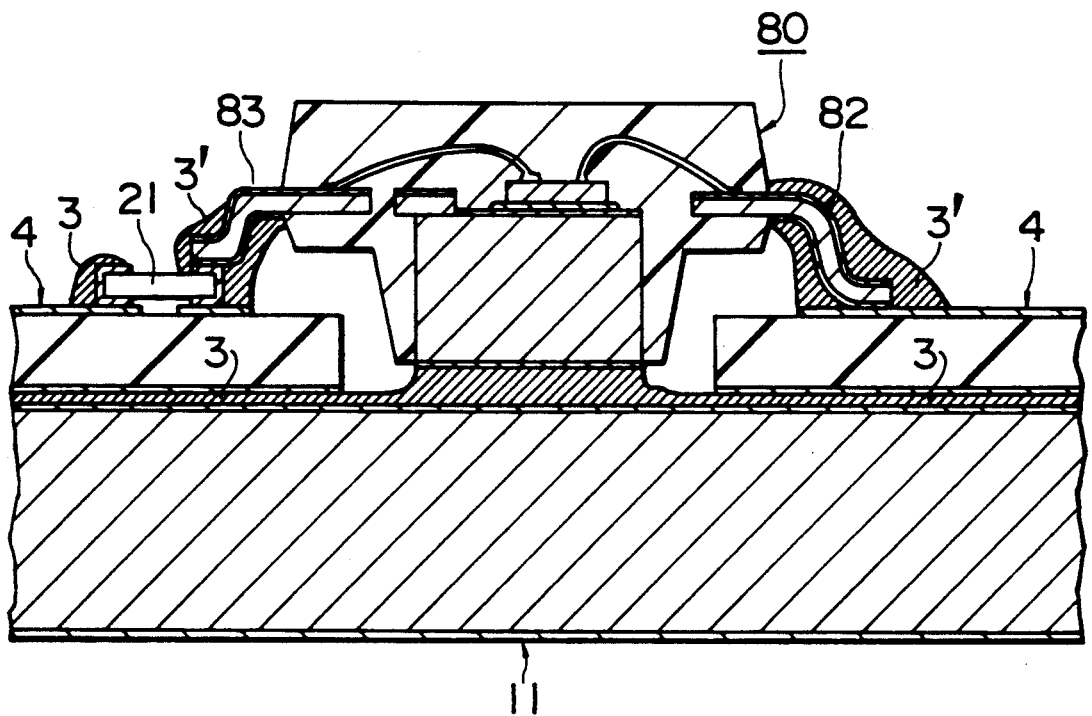
FIG. 20 is a cross-sectional view of an electronic device module in accordance with an embodiment of the present invention.
Figure 21:
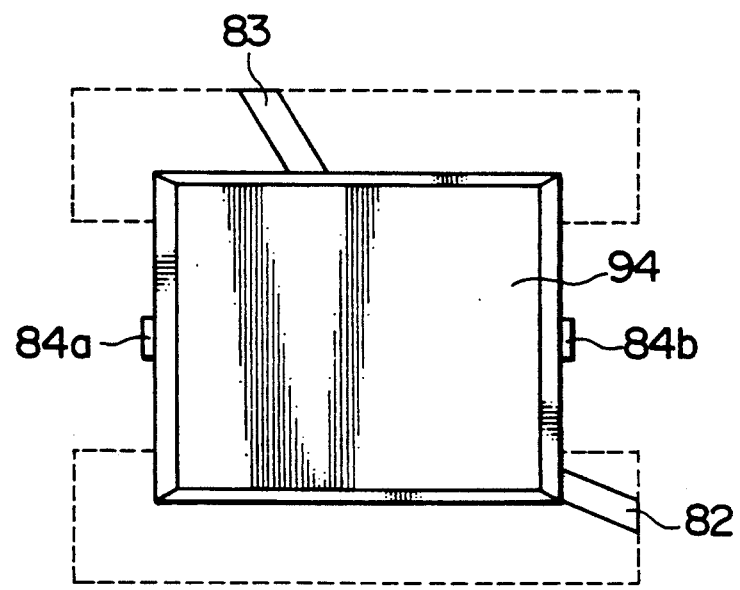
FIG. 21 is a plan view of a packaged semiconductor device in accordance with an embodiment of the invention with electrode leads having different shapes and cuts.

Although the present invention has been explained in conjunction with the foregoing embodiments, the electrode lead shape may be modified as shown in FIGS. 17 to 19 and such parts as a chip capacitor 21 may be disposed below one or both or the electrode leads 83. Further, three of the gate leads and three of the drain leads have been illustrated in the foregoing embodiments, but each two or more of leads may be of course employed. It goes without saying that, in some cases, such leads as shown by dotted lines in FIG. 13 may be cut at desired positions and shaped into such shapes as shown by solid lines in FIG. 21.

As will be appreciated from the foregoing explanation, in accordance with the present invention, material cost can be lowered, rationalization based on automation can be realized, high yield can contribute to reduction in cost price, and high relaibility can be attained.

In addition, since the electrode lead array of the package can be flexibly selected and design margin can be enlarged in the strip line design of the module ceramic substrate, the module can be easily made small in size and high in performance.

We claim:

1. A packaged semiconductor device comprising:
    a semiconductor chip having first and second main surfaces and electrode pads formed on said first surface;
    a plurality of electrode leads;

a plurality of connection conductors for interconnecting said electrode pads and said electrode leads;

a heat sink block attached to said second main surface of said semiconductor chip and consisting of a first portion to which said second main surface of said semiconductor chip is attached and a second portion which extends from said first portion away from said semiconductor chip; and a mold block having a first mold block portion, which encloses said semiconductor chip including said electrode pads, said plurality of electrode leads, said plurality of connection conductors and said first portion of said heat sink block, and a second mold block portion which encloses said second portion of said heat sink block, said second mold block portion being smaller than said first mold block portion and extending from said first mold block portion to form said mold block which has a "T"-shaped cross-section, with said first mold block portion forming a horizontal segment of "T", wherein said second portion of said heat sink block has an exposed surface which is not enclosed by said second mold block portion.

2. A packaged semiconductor device according to claim 1, wherein each of said electrode leads has a free end surface portion that is positioned at a level farther away from said semiconductor chip than a level at which a boundary between said first and second mold block portion is positioned.

3. A packaged semiconductor device according to claim 1, wherein said second mold block portion has side faces which are tapered so that an intersection of the horizontal segment and a vertical segment in said "T"-shaped cross-section of said mold block is wider than the free end of said second mold block.

4. A packaged semiconductor device according to claim 1, wherein said semiconductor chip is a power field effect transistor having source, drain and gate regions, and at least one of said plurality of electrode leads electrically connected to said source, drain and gate regions, respectively, having a comb-like structure with a plurality of juxtaposed electrode leads electrically connected to one another.

5. An electronic device module comprising:
a support plate;
an electrically insulating substrate having a first metallized surface and a second surface provided with a conductor pattern, said substrate being placed on said support plate with said first metallized surface opposed to said support plate, at least one through-hole being formed in said substrate; and
a packaged semiconductor device comprising:
a semiconductor chip,
a plurality of electrode leads,
a plurality of connection conductors for interconnecting said semiconductor chip and said electrode leads, a heat sink blood attached to said chip and consisting of a first portion to which said second main surface of said semiconductor chip is attached and a second portion which extends from said first portion away from said semiconductor chip, and a mold block having a first mold block portion, which encloses said semiconductor chip, said plurality of electrode leads, said plurality of connection conductors and said first portion of said heat sink block, and a second mold block portion which encloses said second portion of said heat sink block, said second mold block portion being smaller than said first mold block portion and extending from said first mold block portion to form said mold block which has a "T"-shaped cross-section, with said first mold block portion forming a horizontal segment of "T", wherein said second portion of said heat sink block has an exposed surface which is not enclosed by said second mold block portion, and wherein each of said electrode leads has a free end surface portion that is positioned at a level farther away from said semiconductor chip than a level at which a boundary between said first and second mold block portion is positioned, wherein said packaged semiconductor device being mounted on said electrically insulating substrate and said support plate through one of said at least one through-holes in said substrate, wherein the end portions of said electrode leads are placed on and are electrically connected to said conductor pattern on said second surface of said electrically insulating substrate, and an electrically conductive bonding material layer is provided between said exposed surface of said second portion of said heat sink block and said support plate, said bonding material layer having a thickness equal to or smaller that of said substrate.

6. An electronic device module according to claim 5, wherein said second mold block portion has side faces which are tapered so that an intersection of the horizontal segment and a vertical segment in said "T"-shaped cross-section of said mold block is wider than its free end of said second mold block.

7. An electronic device module according to claim 5, wherein said conductor pattern on said second surface of said substrate includes strip line conductors, said semiconductor chip includes a high frequency power field effect transistor operable at a GHz frequency band and having source, drain and gate regions, and at least one of said plurality of electrode leads being electrically connected to said source, drain and gate regions, respectively, having a comb-like structure with a plurality of juxtaposed electrode leads electrically connected to one another so that each of said juxtaposed electrode leads serves to be connected with one of said strip line conductors for adjustment of impedance of the strip line conductor.

* * * * *

UNITED STATES PATENT AND TRADEMARK OFFICE
CERTIFICATE OF CORRECTION

PATENT NO.   :   5,198,964

DATED        :   March 30, 1993

INVENTOR(S)  :   ITO, et al.

It is certified that error appears in the above-identified patent and that said Letters Patent is hereby corrected as shown below:

Column 16, line 1: Change "blood" to --block--
Column 16, lines 2-3: Delete "said second main surface of"

Signed and Sealed this

Seventeenth Day of June, 1997

Attest:

BRUCE LEHMAN

Attesting Officer

Commissioner of Patents and Trademarks